(12) United States Patent
Li et al.

(10) Patent No.: US 9,113,572 B2
(45) Date of Patent: Aug. 18, 2015

(54) BOARD AND COMMUNICATION DEVICE

(71) Applicant: Huawei Technologies Co., Ltd., Shenzhen, Guangdong (CN)

(72) Inventors: Yutao Li, Shenzhen (CN); Qi Shu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 147 days.

(21) Appl. No.: 13/952,242

(22) Filed: Jul. 26, 2013

(65) Prior Publication Data
US 2013/0314871 A1    Nov. 28, 2013

Related U.S. Application Data

(63) Continuation of application No. PCT/CN2011/080010, filed on Sep. 22, 2011.

(30) Foreign Application Priority Data

Feb. 24, 2011   (CN) .......................... 2011 1 0045305

(51) Int. Cl.
*H05K 1/16*    (2006.01)
*H05K 1/18*    (2006.01)
*H05K 7/14*    (2006.01)

(52) U.S. Cl.
CPC .................. *H05K 1/182* (2013.01); *H05K 1/18* (2013.01); *H05K 7/1487* (2013.01); *H05K 2201/09063* (2013.01); *H05K 2201/10189* (2013.01); *H05K 2201/10446* (2013.01)

(58) Field of Classification Search
USPC .......... 174/260, 520, 541, 559; 361/692, 729, 361/730, 736, 752, 759, 797; 439/55, 59, 439/63, 83, 345, 347, 490, 507
See application file for complete search history.

(56) References Cited

U.S. PATENT DOCUMENTS

| | | | |
|---|---|---|---|
| 4,457,570 A * | 7/1984 | Bogese, II ....................... 439/59 |
| 6,319,062 B1 * | 11/2001 | Ma et al. ................... 439/607.38 |
| 6,385,053 B1 | 5/2002 | Parizi et al. |
| 6,392,319 B1 | 5/2002 | Zebermann et al. |
| 2001/0019904 A1 | 9/2001 | Watanabe et al. |
| 2004/0121625 A1* | 6/2004 | Togashi ........................... 439/63 |
| 2008/0248661 A1 | 10/2008 | Costello |
| 2010/0073591 A1 | 3/2010 | Choi et al. |
| 2011/0263142 A1* | 10/2011 | Huang et al. .................... 439/83 |

FOREIGN PATENT DOCUMENTS

CN    2622886 Y    6/2004
CN    1761167 A    4/2006
(Continued)

OTHER PUBLICATIONS

International Search Report dated Dec. 22, 2011 in connection with International Patent Application No. PCT/CN2011/080010.

*Primary Examiner* — Xiaoliang Chen

(57) ABSTRACT

Embodiments of the present invention provide a board and a communication device, the board comprises a printed circuit board PCB, wherein a side of the printed circuit board PCB is set with a dent, a bottom of the dent is set with a connector, the side of the printed circuit board PCB is further set with a panel, the panel shrinks into a groove at a position corresponding to the connector, so as to make the groove be embedded into the dent, and a bottom of the groove and an interface of the connector are correspondingly opened with a through hole.

8 Claims, 7 Drawing Sheets

(56) References Cited

FOREIGN PATENT DOCUMENTS

| CN | 2879599 Y | 3/2007 |
| CN | 200962474 Y | 10/2007 |
| CN | 201115002 Y | 9/2008 |
| CN | 201440516 U | 4/2010 |
| CN | 201490524 U | 5/2010 |
| CN | 102170751 A | 8/2011 |

* cited by examiner

BOARD AND COMMUNICATION DEVICE

CROSS-REFERENCE TO RELATED APPLICATIONS

This application is a continuation of International Application No. PCT/CN2011/080010, filed on Sep. 22, 2011, which claims priority to Chinese Patent Application No. 201110045305.0, filed on Feb. 24, 2011, both of which are hereby incorporated by reference in their entireties.

TECHNICAL FIELD

The present invention relates to communication technologies, and in particular, to a board and a communication device.

BACKGROUND

An existing frame communication device (for example, a switch, a router, a blade server, and so on) may include a printed circuit board (Printed Circuit Board, referred to as PCB), and a connector and a panel is set on the PCB, where a plane where an interface of the connector is located is on a same level with the panel.

In the prior art, the interface of the connector usually needs to perform signal transmission through a cable (for example, a network cable or an optical fiber). However, an RJ45 connector (such as an RJ45 connector of a network cable) and a plastic jacket (such as a jacket of a network cable and a jacket of an optical fiber) of the cable is long, and a diameter and a bend radius of the cable are large, making the cable occupy large outlet space of the frame communication device, thereby causing decrease in depth of the PCB and layout space for components on the PCB, and reducing an integration level of the PCB.

SUMMARY

Embodiments of the present invention provide a board and a communication device, so as to improve an integration level of a PCB.

An embodiment of the present invention provides a board, which includes a PCB, where a side of the PCB is set with a dent, a bottom of the dent is set with a connector, the side of the PCB is further set with a panel, the panel shrinks into a groove at a position corresponding to the connector, so as to make the groove be embedded into the dent, and a bottom of the groove and an interface of the connector are correspondingly opened with a through hole.

An embodiment of the present invention further provides a communication device, which includes at least one foregoing board, where the at least one board is set with a chip, the at least one board is connected to a power supply and a fan through a backplane, and the power supply is connected to the fan.

It may be known from the foregoing technical solutions that, according to the embodiments of the present invention, the PCB forms the dent at a position where the foregoing connector is set, and the panel shrinks into the groove in the position corresponding to the connector, and the bottom of the groove and the interface of the connector are correspondingly opened with the through hole, which can avoid a problem of decrease in depth of the PCB and layout space for components on the PCB caused by a long RJ45 connector and plastic jacket of a cable and a large diameter and bend radius of the cable, thereby improving an integration level of the PCB.

BRIEF DESCRIPTION OF THE DRAWINGS

To illustrate the technical solutions in the embodiments of the present invention or in the prior art more clearly, accompanying drawings needed for describing the embodiments or the prior art are briefly introduced in the following. Obviously, the accompanying drawings in the following description are only some embodiments of the present invention, and persons of ordinary skill in the art may obtain other accompanying drawings from these accompanying drawings without making creative efforts.

DETAILED DESCRIPTION

To make the objectives, technical solutions, and advantages of the present invention more clear, the following clearly and completely describes the technical solutions in the embodiments of the present invention with reference to the accompanying drawings in the embodiments of the present invention. Apparently, the embodiments described are merely part of rather than all of the embodiments of the present invention. All other embodiments obtained by persons of ordinary skill in the art based on the embodiments of the present invention without making creative efforts shall fall within the protection scope of the present invention.

Figure 1:
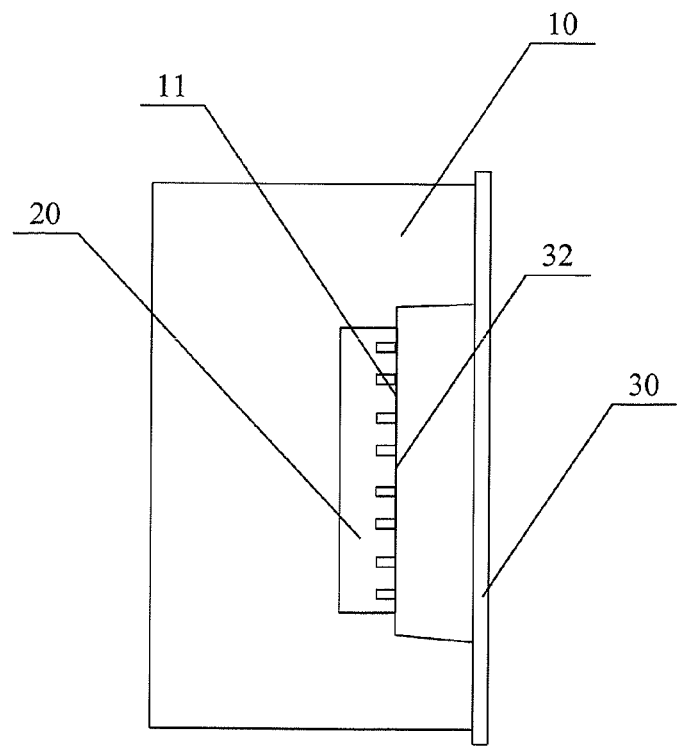
FIG. 1 is a schematic top view of aboard according to a first embodiment of the present invention.
Figure 2:
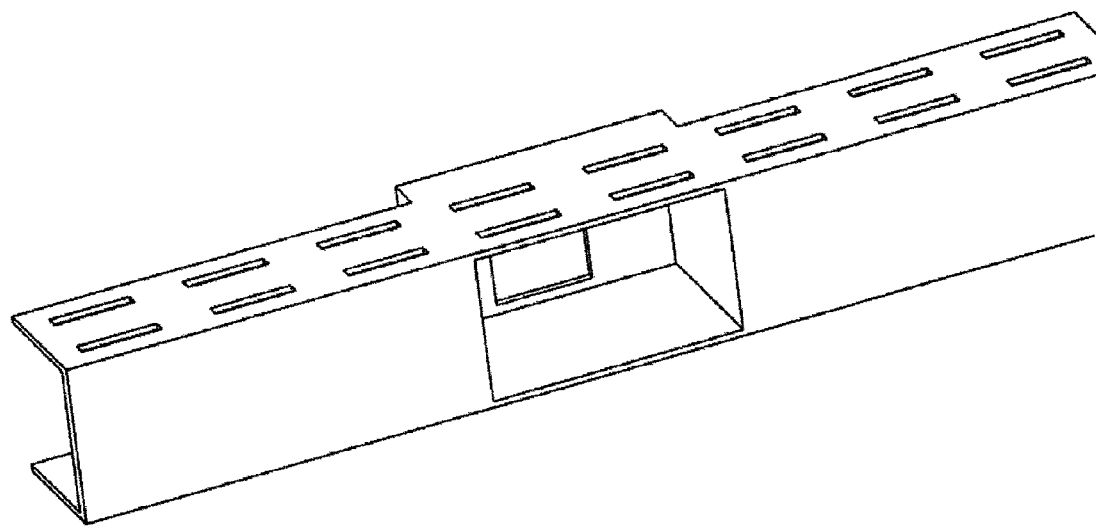
FIG. 2 is a schematic three-dimensional view of a panel in FIG. 1.
Figure 3:
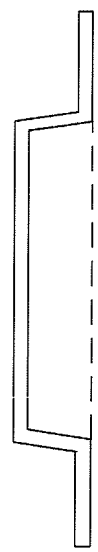
FIG. 3 is a schematic sectional view of the panel in FIG. 1.
Figure 4:
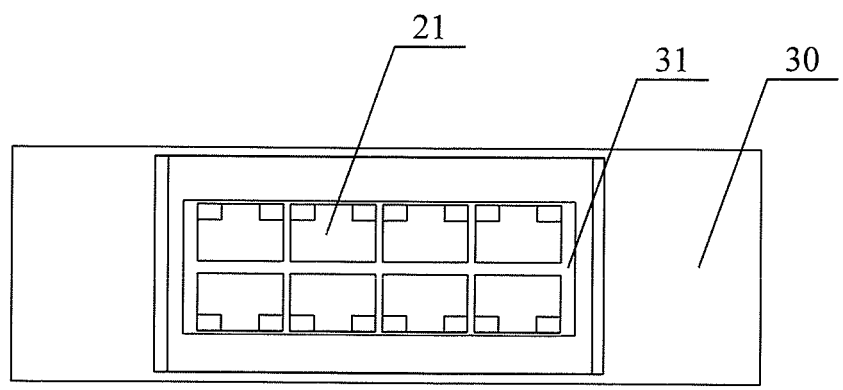
FIG. 4 is a schematic front view of the board according to the first embodiment of the present invention.
Figure 5:
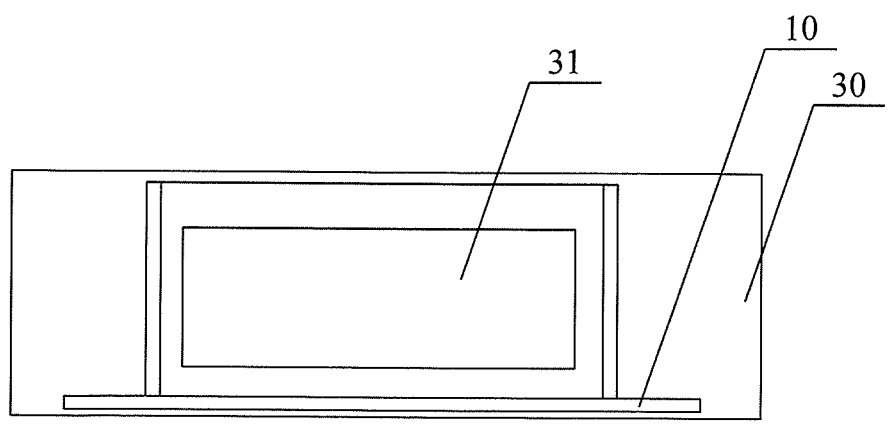
FIG. 5 is a schematic rear view of the board according to the first embodiment of the present invention.

FIG. 1 to FIG. 5 are related schematic diagrams of a board according to a first embodiment of the present invention. As shown in FIG. 1 to FIG. 5, the board in this embodiment may include a PCB 10, where a side of the PCB 10 is set with a dent, a bottom 11 of the dent is set with a connector 20, and the side of the PCB 10 is further set with a panel 30. The panel 30 shrinks into a groove at a position corresponding to the connector 20, and a bottom 32 of the groove and an interface 21 of the connector 20 are correspondingly opened with a through hole 31. The connector 20 in this embodiment is set at an edge area of the dent of the PCB 10.

In this embodiment, the panel 30 may be made into a deformed panel through die casting and mould open, that is, at the position corresponding to the connector 20, the panel 30 shrinks into the groove, and can keep electro magnetic compatibility (Electro Magnetic Compatibility, referred to as EMC) at the same time. Depth (distance of shrinkage) of the groove of the panel 30 may be determined according to outlet space needed, but the depth of the groove cannot be too large lest operations of plugging and unplugging a cable are affected, for example, the depth of the groove may be 10 mm to 25 mm.

In this embodiment, the PCB forms the dent at a position where the foregoing connector is set, and the panel shrinks into the groove at the position corresponding to the foregoing connector, and the bottom of the foregoing groove and the interface of the foregoing connector are correspondingly opened with the through hole, which can avoid a problem of decrease in the depth of the PCB and layout space for components on the PCB caused by a long RJ45 connector and plastic jacket of the cable and a large diameter and bend radius of the cable, thereby improving an integration level of the PCB.

Figure 6:
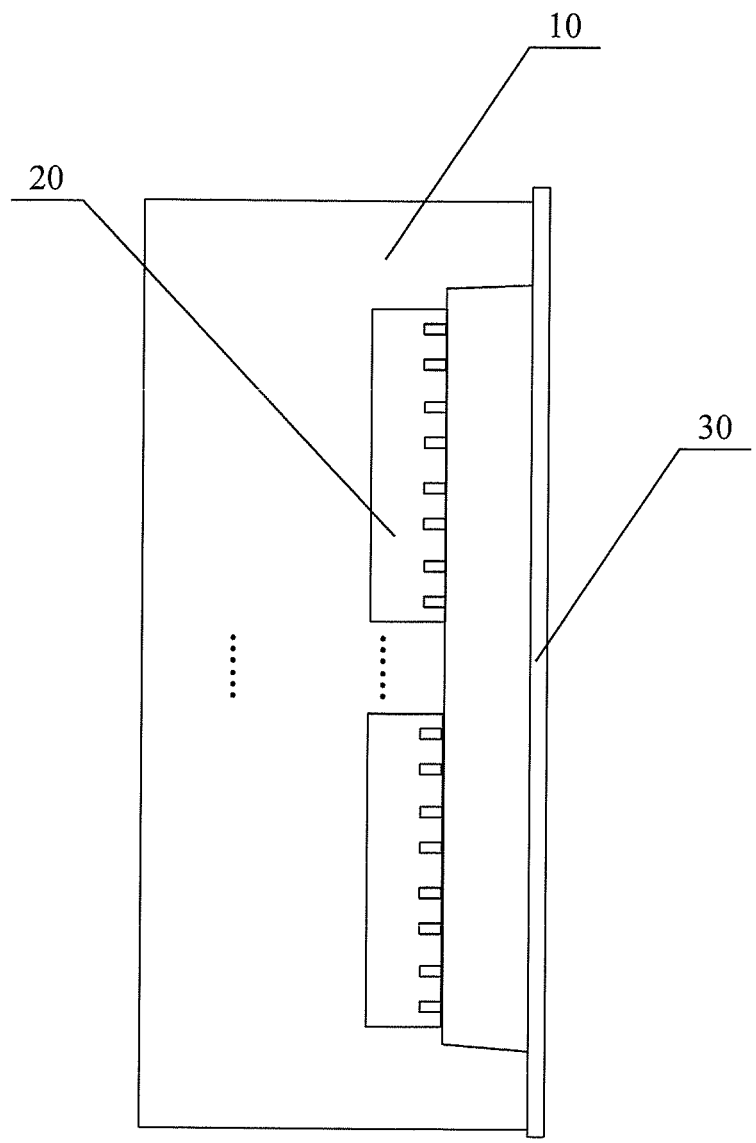
FIG. 6 is a schematic top view of aboard according to a second embodiment of the present invention.
Figure 7:
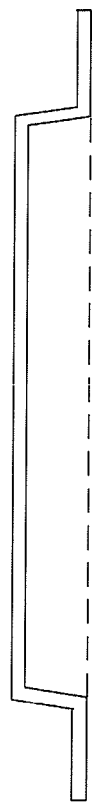
FIG. 7 is a schematic sectional view of a panel in FIG. 6.
Figure 8:
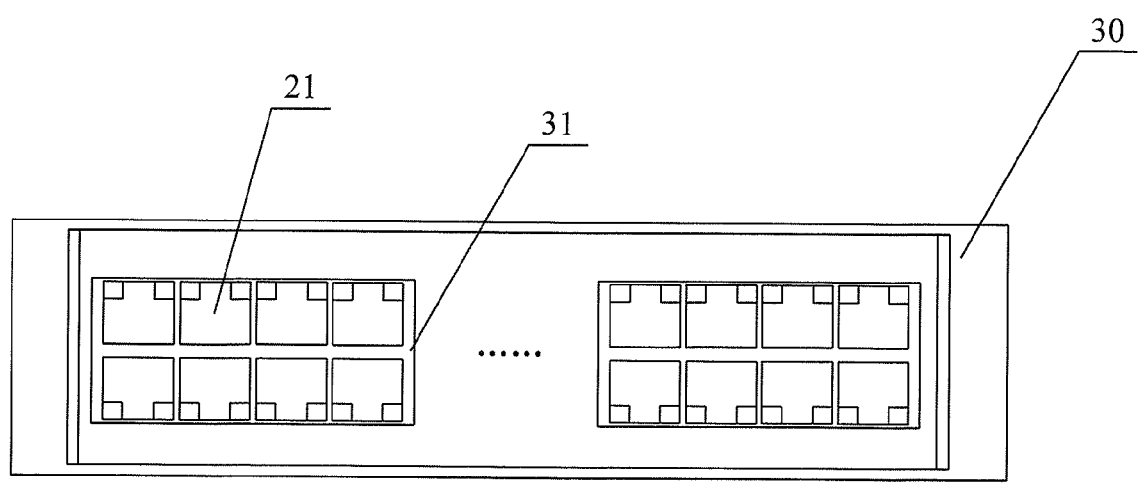
FIG. 8 is a schematic front view of a board according to the second embodiment of the present invention.
Figure 9:
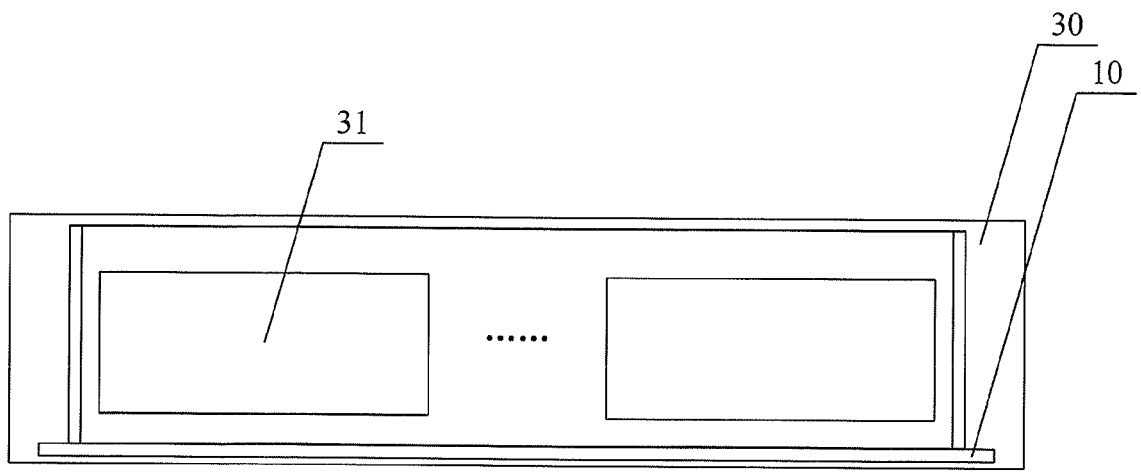
FIG. 9 is a schematic rear view of a board according to the second embodiment of the present invention.
Figure 10:
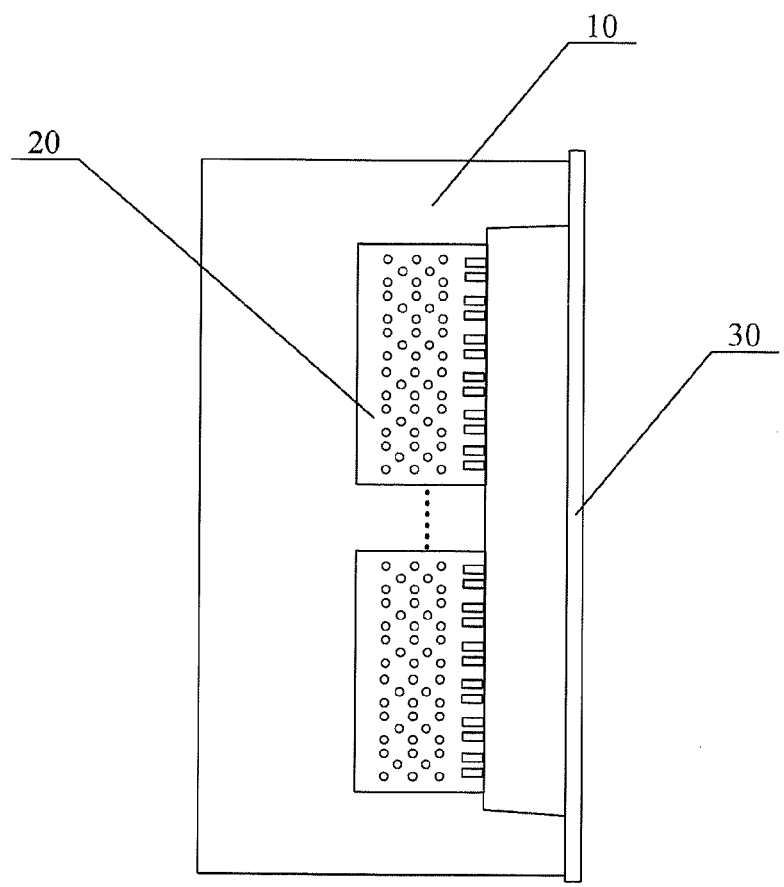
FIG. 10 is a schematic top view of another board according to the second embodiment of the present invention.
Figure 11:
FIG. 11 is a schematic sectional view of a panel shown FIG. 10.
Figure 12:
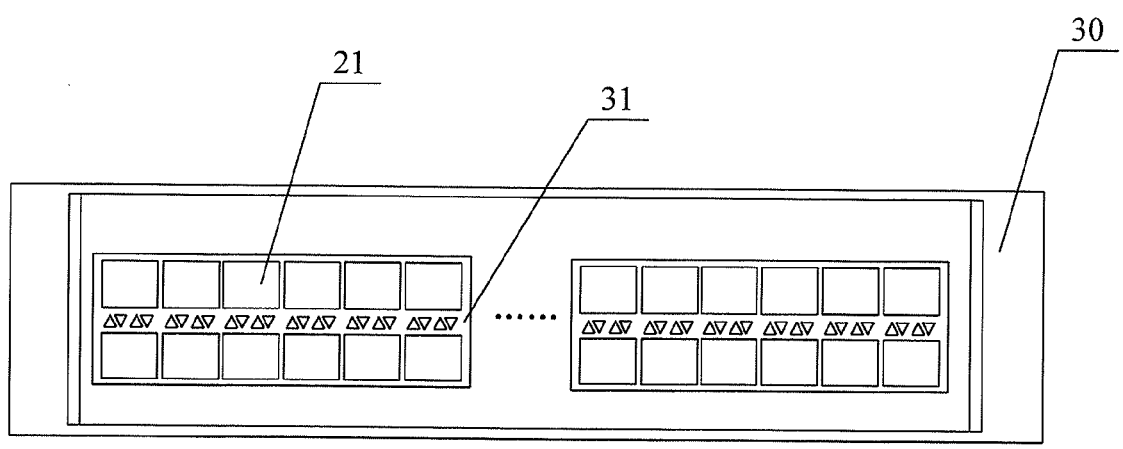
FIG. 12 is a schematic front view of another board according to the second embodiment of the present invention.
Figure 13:
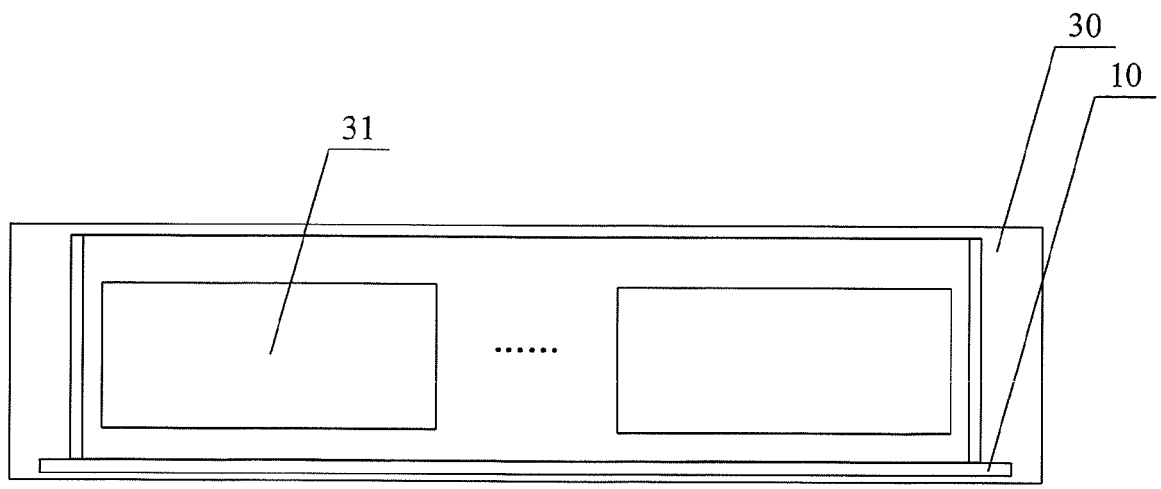
FIG. 13 is a schematic rear view of another board according to the second embodiment of the present invention.

FIG. 6 to FIG. 13 are related schematic diagrams of a board according to a second embodiment of the present invention. As shown in FIG. 6 to FIG. 13, on the basis of the first embodiment, the board in this embodiment may include multiple connectors 20 set on a PCB 10. The PCB 10 forms a dent at a position where a connector 20 is set, a panel 30 shrinks into a groove at a position corresponding to the connector 20, and a bottom of the groove and an interface 21 of the connector 20 are correspondingly opened with a through hole 31. The connector 20 in this embodiment is set at an edge area of the dent of the PCB 10.

In this embodiment, the PCB 10 can form multiple dents corresponding to each connector 20, or form one dent corresponding to all the connectors 20; and accordingly, the panel 30 may shrink into multiple grooves corresponding to each connector 20, or shrink into one groove corresponding to all the connectors 20, which is not limited in the present invention, and the latter is taken as an example for illustration of the figures.

It should be noted that, in the embodiments of the present invention, the foregoing connector may include, but are not limited to, an Ethernet electrical interface connector, or an optical interface connector, or a serial attached small computer system interface (Serial Attached Small Computer System Interface, referred to as SAS) connector or a video graphics array (Video Graphics Array, referred to as VGA) connector. The connector 20 in FIG. 1 to FIG. 9 are illustrated by taking the Ethernet electrical interface connector as an example, while the connector 20 in FIG. 10 to FIG. 13 are illustrated by taking the optical interface connector as an example.

An embodiment of the present invention further provides a communication device (not shown in a figure), which includes at least one board provided in the embodiments of the present invention, where the at least one board is set with a chip, the at least one board is connected to a power supply and a fan through a backplane, and the power supply is connected to the fan.

Finally, it should be noted that the foregoing embodiments are merely provided for illustrating the technical solutions of the present invention, but are not intended to limit the present invention. Persons of ordinary skill in the art should understand that although the present invention has been illustrated in detail with reference to the foregoing embodiments, they may still make modifications to the technical solutions recorded in the foregoing embodiments, or make equivalent replacements made to part of the technical features in the technical solutions, as long as such modifications or replacements do not make the nature of the corresponding technical solutions depart from the spirit and scope of the present invention.

What is claimed is:

1. A board, comprising:
    a printed circuit board (PCB), wherein a side of the PCB is set with a dent;
    a bottom of the dent is set with a connector;
    the side of the PCB is further set with a panel, wherein the panel shrinks into a groove at a position corresponding to the connector, so as to embed the groove into the dent; and
    a bottom of the groove and an interface of the connector are correspondingly opened with a through hole.

2. The board according to claim 1, wherein the connector is set at an edge area of the dent.

3. The board according to claim 1, wherein depth of the groove is between about 10 mm to 25 mm.

4. The board according to claim 1, wherein the connector comprises an Ethernet electrical interface connector, an optical interface connector, a serial attached small computer system interface (SAS) connector, or a video graphics array (VGA) connector.

5. A communication device, comprising:
    at least one board comprising:
        a printed circuit board (PCB), wherein a side of the PCB is set with a dent,
        a bottom of the dent is set with a connector,
        the side of the PCB is further set with a panel, wherein the panel shrinks into a groove at a position corresponding to the connector, so as to embed the groove into the dent, and
        a bottom of the groove and an interface of the connector are correspondingly opened with a through hole; and
    wherein the at least one board is set with a chip, the at least one board is connected to a power supply and a fan through a backplane, and the power supply is connected to the fan.

6. The communication device according to claim 5, wherein the connector is set at an edge area of the dent.

7. The communication device according to claim 5, wherein depth of the groove is between about 10 mm to 25 mm.

8. The communication device according to claim 5, wherein the connector comprises an Ethernet electrical interface connector, or an optical interface connector, or a serial attached small computer system interface (SAS) connector, or a video graphics array (VGA) connector.

* * * * *